United States Patent
Ishizaki et al.

(10) Patent No.: US 8,605,446 B2
(45) Date of Patent: Dec. 10, 2013

(54) ELECTRONIC APPARATUS

(75) Inventors: Kiyokazu Ishizaki, Akishima (JP); Yasunari Ukita, Omi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 29 days.

(21) Appl. No.: 13/275,910

(22) Filed: Oct. 18, 2011

(65) Prior Publication Data
US 2012/0236516 A1  Sep. 20, 2012

(30) Foreign Application Priority Data
Mar. 16, 2011 (JP) ................... 2011-058438

(51) Int. Cl.
*H05K 7/00* (2006.01)

(52) U.S. Cl.
USPC .......................... 361/728; 361/803

(58) Field of Classification Search
USPC ......... 361/728–730, 752, 796, 800, 721, 760, 361/754, 759, 803; 257/776, 777
See application file for complete search history.

(56) References Cited

U.S. PATENT DOCUMENTS

| | | | | |
|---|---|---|---|---|
| 4,139,881 A | * | 2/1979 | Shimizu et al. | 361/760 |
| 4,641,222 A | * | 2/1987 | Derfiny et al. | 361/768 |
| 5,334,422 A | * | 8/1994 | Myers et al. | 427/552 |
| 5,683,788 A | * | 11/1997 | Dugan et al. | 428/209 |
| 6,405,920 B1 | * | 6/2002 | Brunner et al. | 228/248.1 |

FOREIGN PATENT DOCUMENTS

| | | |
|---|---|---|
| JP | UM60-2873 | 6/1983 |
| JP | UM3-99467 | 1/1990 |
| JP | 06-021269 | 6/1994 |
| JP | 08-078826 | 3/1996 |
| JP | 10-229263 | 8/1998 |
| JP | 2003-243814 | 8/2003 |
| JP | 2008-263030 | 10/2008 |

OTHER PUBLICATIONS

Japanese Patent Application No. 2011-058438; Notice of Reasons for Rejection; Mailed Dec. 13, 2011 (English translation).

* cited by examiner

*Primary Examiner* — Hung S Bui
(74) *Attorney, Agent, or Firm* — Blakely, Sokoloff, Taylor & Zafman LLP

(57) ABSTRACT

According to one embodiment, an electronic apparatus includes a housing, a board in the housing, a pad on the board, and a component. The pad includes a first portion and a second portion. The second portion includes a protrusion toward the first portion. The component includes a first electrode connected to the first portion and a second electrode connected to the second portion.

5 Claims, 10 Drawing Sheets

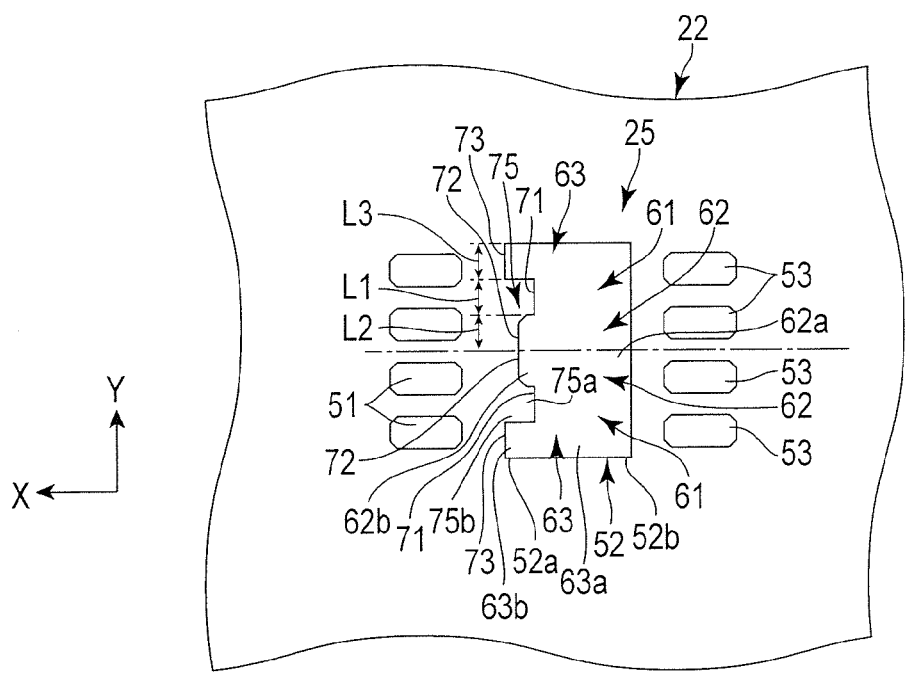
F I G. 3
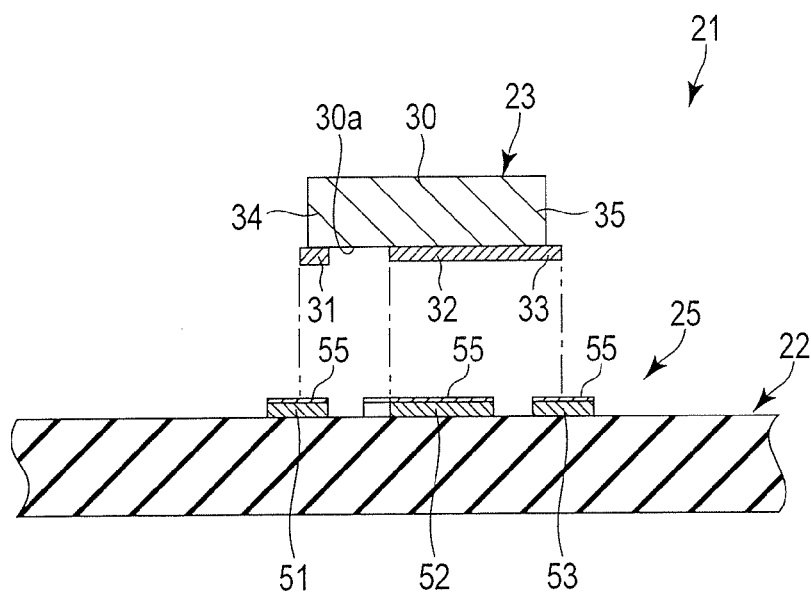
F I G. 4

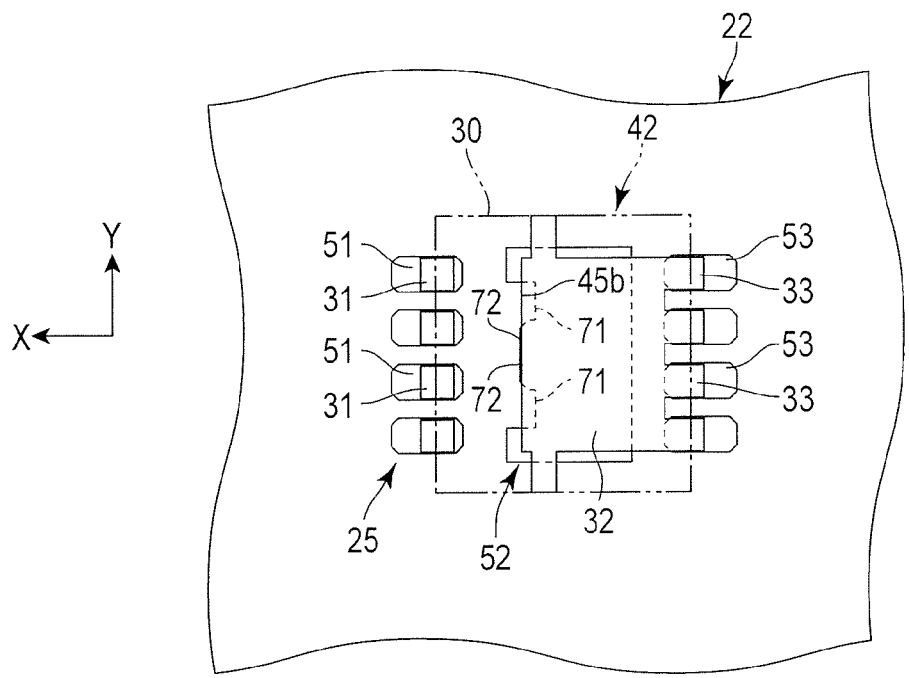
F I G. 7
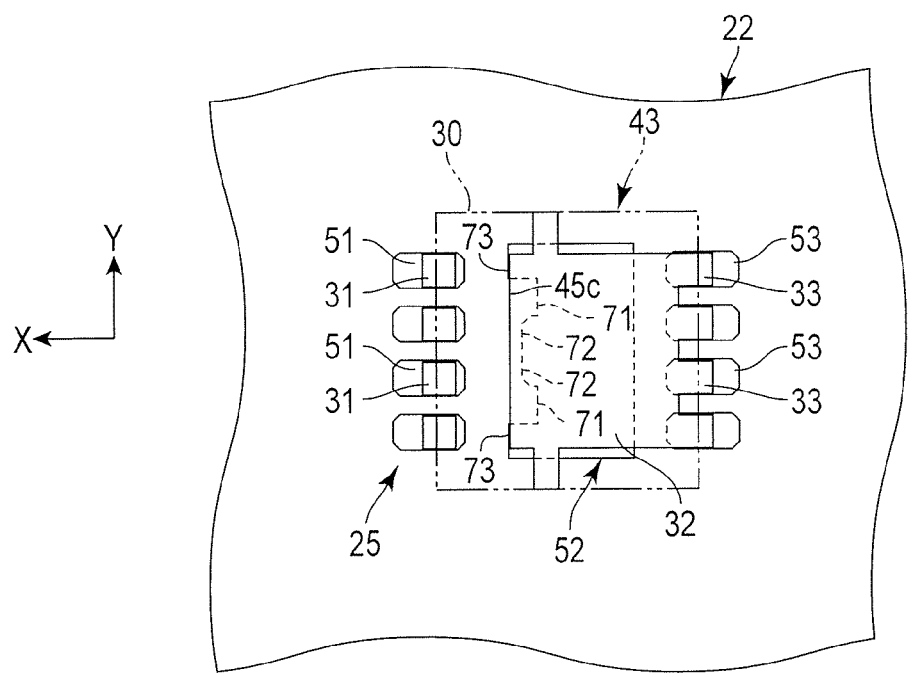
F I G. 8

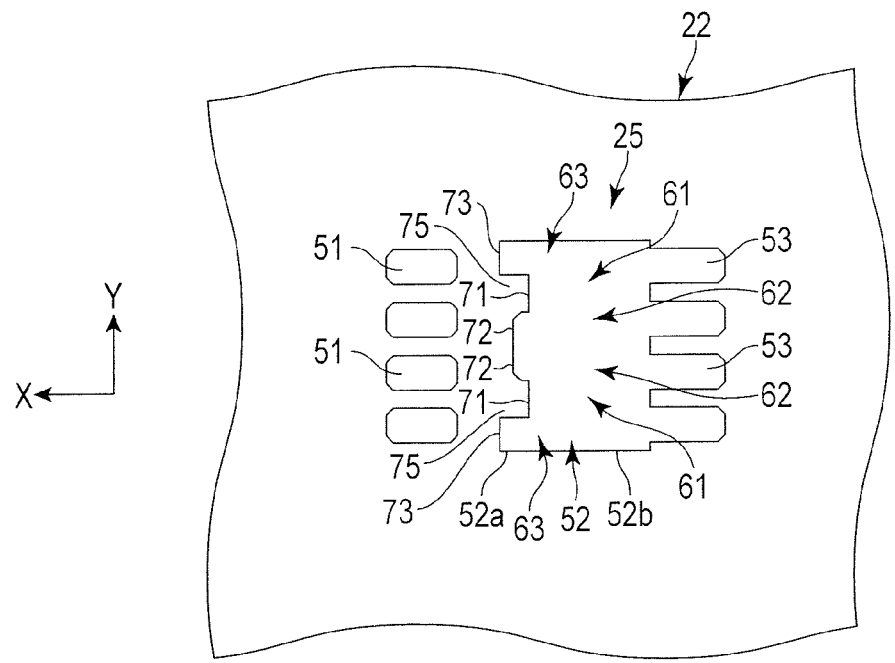
F I G. 9
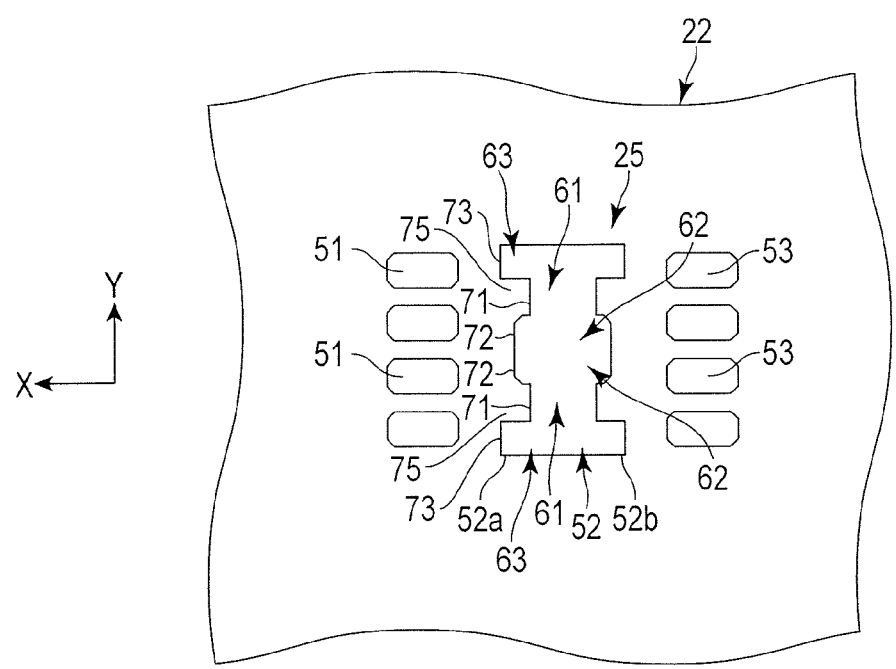
F I G. 10

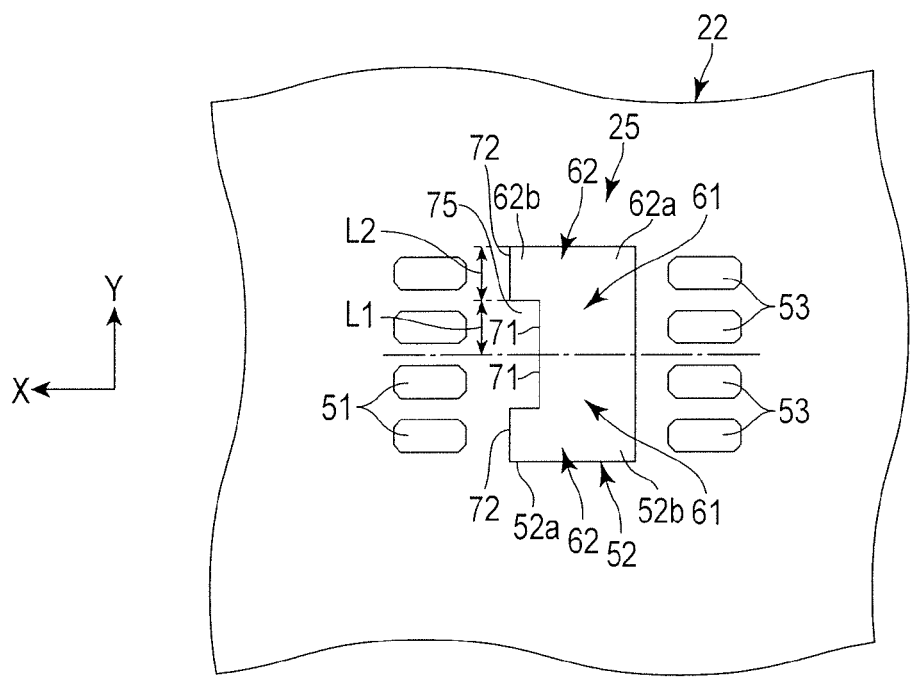
F I G. 11
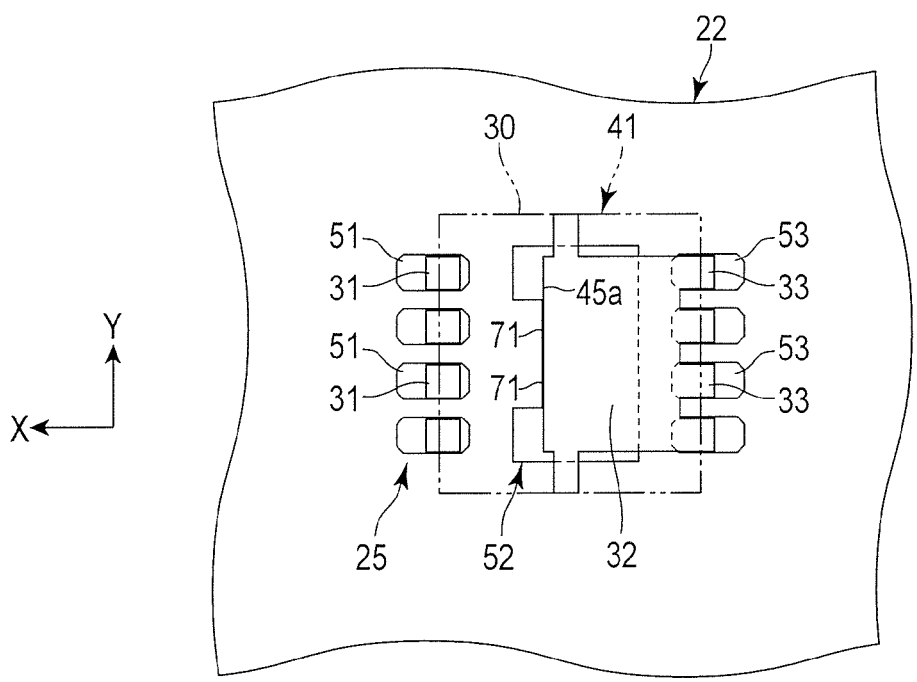
F I G. 12

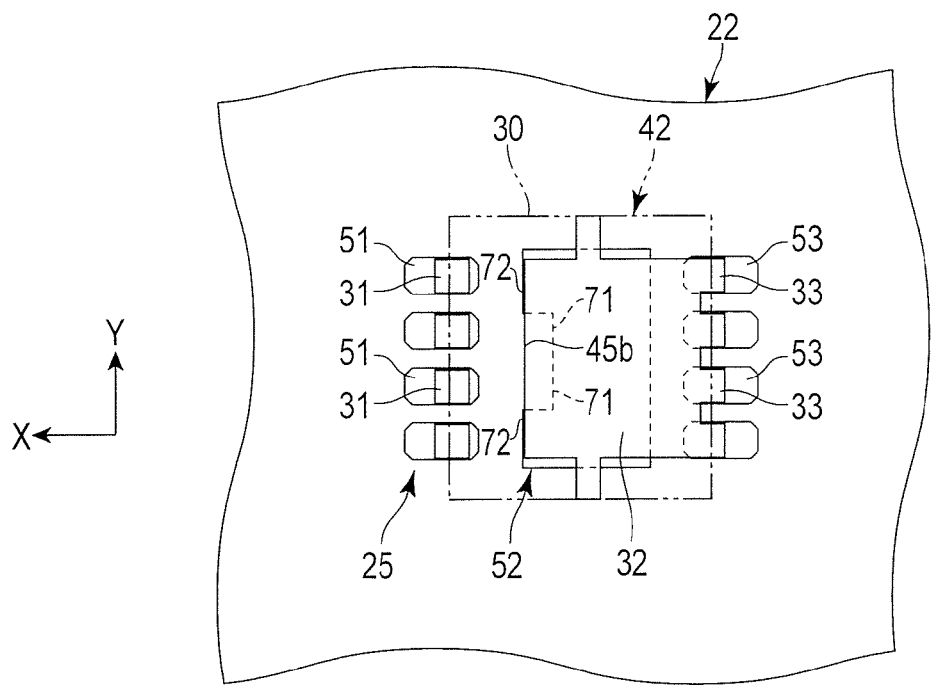
F I G. 13
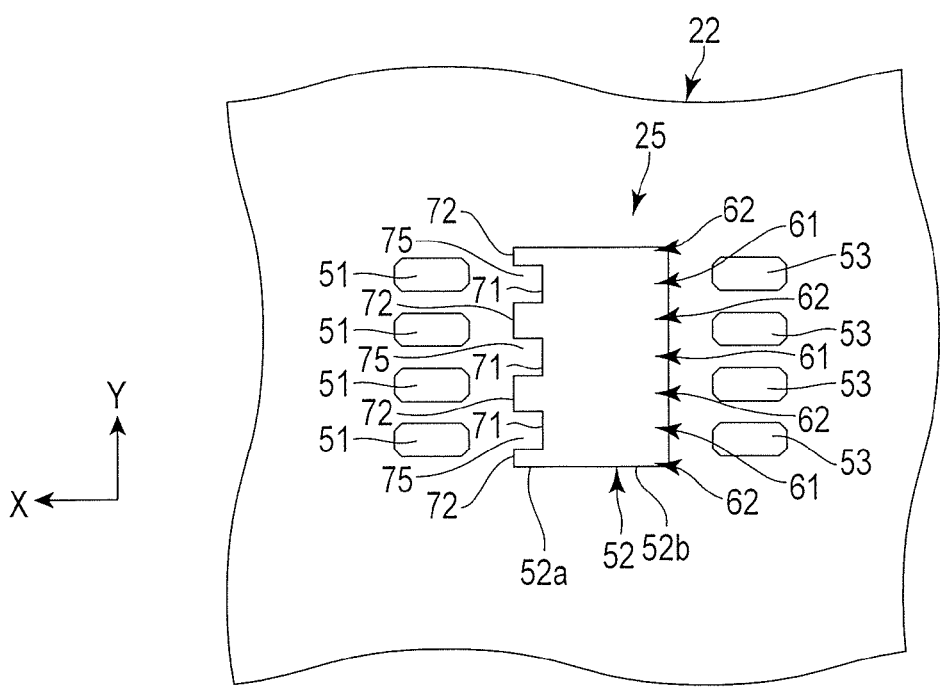
F I G. 14

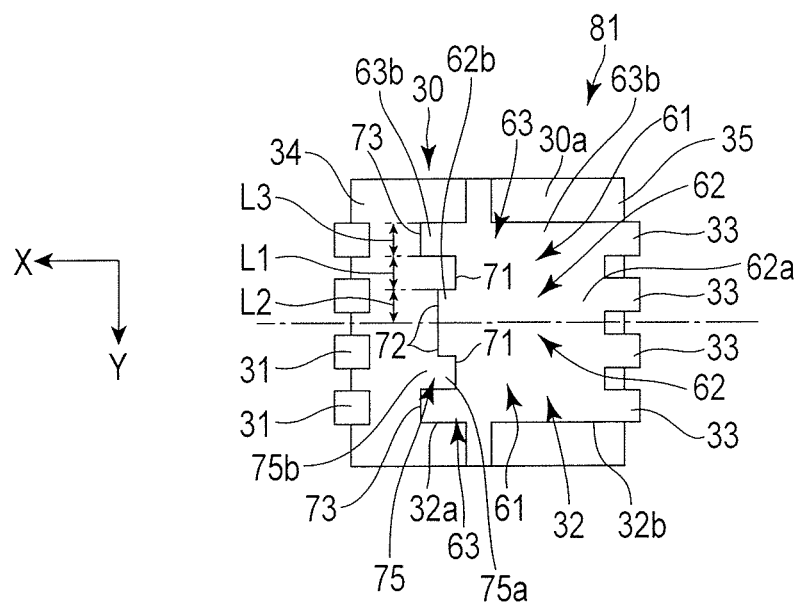
F I G. 15
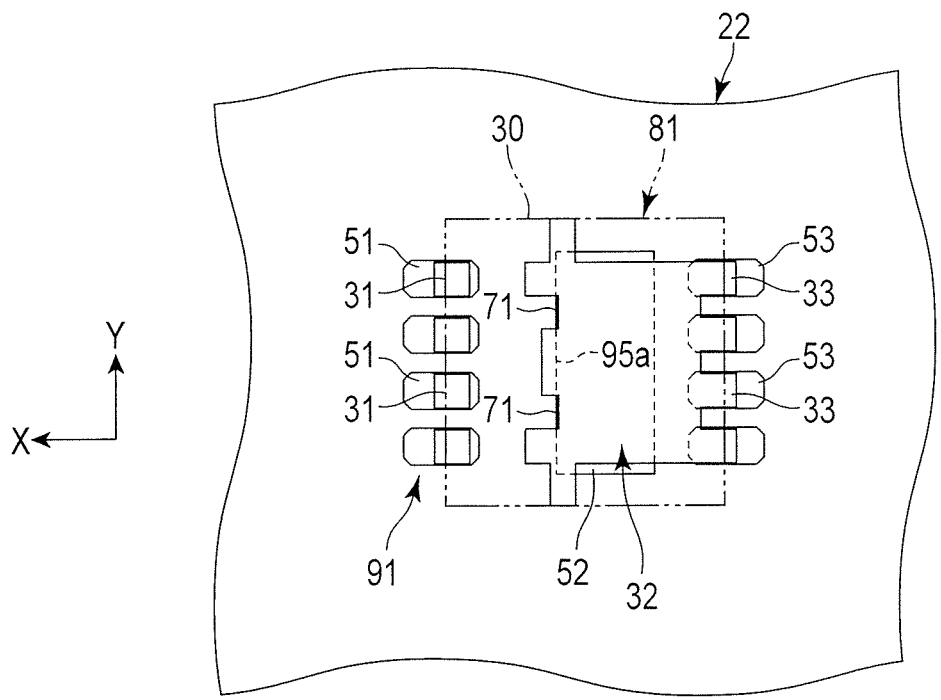
F I G. 16

US 8,605,446 B2

ELECTRONIC APPARATUS

CROSS-REFERENCE TO RELATED APPLICATIONS

This application is based upon and claims the benefit of priority from prior Japanese Patent Application No. 2011-058438 filed Mar. 16, 2011, the entire contents of which are incorporated herein by reference.

FIELD

Embodiments described herein relate generally to electronic apparatuses.

BACKGROUND

There is provided a board that suppresses the positional deviation of a surface-mounted component.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is an exemplary plan view of a pad according to the first embodiment;

FIG. 4 is an exemplary cross-sectional view of the board shown in FIG. 2;

FIG. 7 is an exemplary plan view of the mounting of a second component on the pad shown in FIG. 3;

FIG. 8 is an exemplary plan view of the mounting of a third component on the pad shown in FIG. 3;

FIG. 9 is an exemplary plan view of a first modification of the pad according to the first embodiment;

FIG. 10 is an exemplary plan view of a second modification of the pad according to a second embodiment;

FIG. 11 is an exemplary plan view of a pad according to a second embodiment;

FIG. 12 is an exemplary plan view of the mounting of a first component on the pad shown in FIG. 11;

FIG. 13 is an exemplary plan view of the mounting of a second component on the pad shown in FIG. 11;

FIG. 14 is an exemplary plan view of a modification of the pad according to the second embodiment;

FIG. 15 is an exemplary bottom view of a component according to a third embodiment;

FIG. 16 is an exemplary plan view of the mounting of the component shown in FIG. 15 on a first pad;

DETAILED DESCRIPTION

Various embodiments will be described hereinafter with reference to the accompanying drawings.

In general, according to one embodiment, an electronic apparatus comprises a housing, a board in the housing, a pad on the board, and a component. The pad comprises a first portion and a second portion. The second portion comprises a protrusion toward the first portion. The component comprises a first electrode connected to the first portion and a second electrode connected to the second portion.

Hereinafter, embodiments will be described with reference to the drawings.

First Embodiment

FIGS. 1 to 8 show an electronic apparatus 1 according to a first embodiment. The electronic apparatus 1 is, for example, a notebook portable computer (notebook PC). Electronic apparatuses to which this embodiment can be applied are not limited thereto. This embodiment can be widely applied to various kinds of electronic apparatuses including, for example, a television, a mobile phone, a smart phone, an electronic book terminal, and a game machine.

Figure 1:
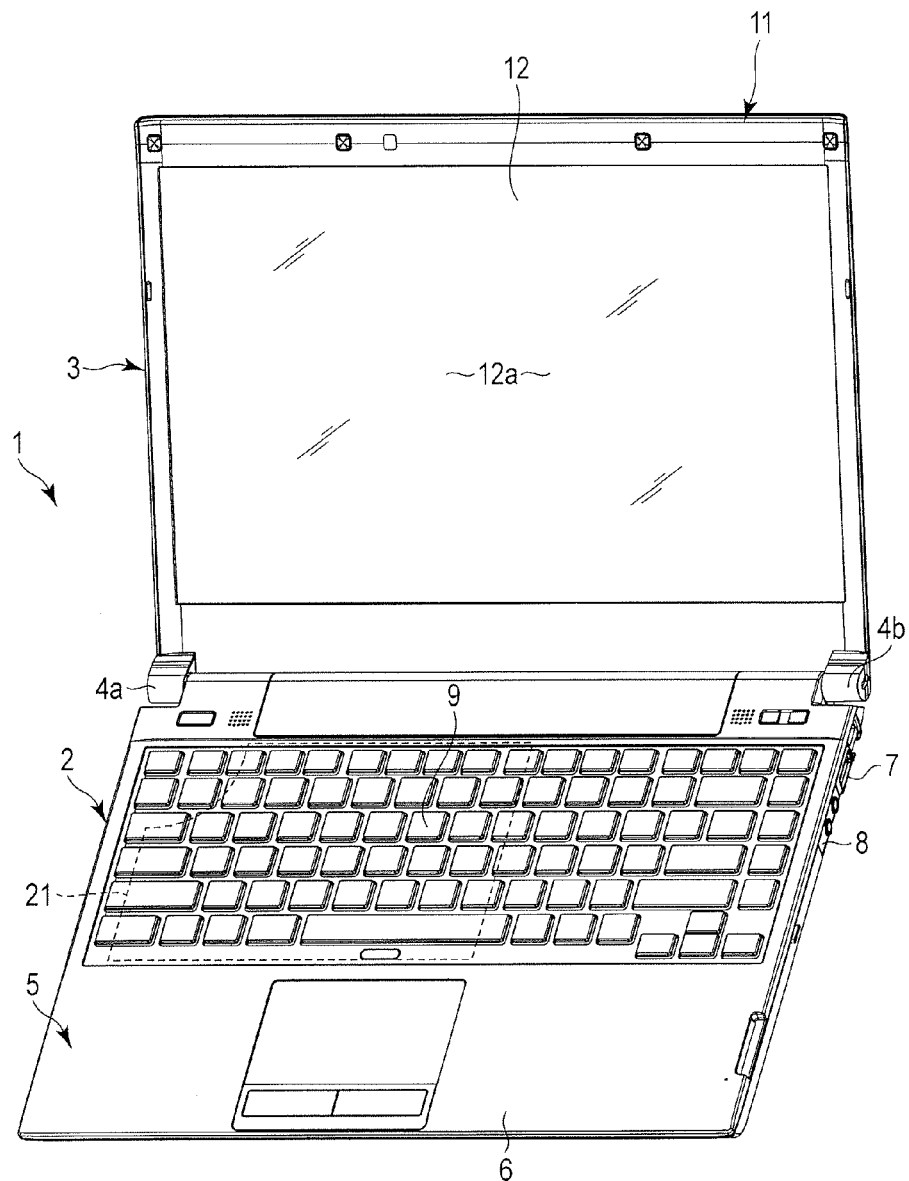
FIG. 1 is an exemplary perspective view of an electronic apparatus according to a first embodiment.

As shown in FIG. 1, the electronic apparatus 1 includes a first unit 2, a second unit 3, and hinge portions 4a and 4b. The first unit 2 is a main unit provided with, for example, a main board. The first unit 2 includes a first housing 5. The first housing 5 has a flat box shape including an upper wall 6, a lower wall 7, and a peripheral wall 8.

The lower wall 7 faces a desk surface when the electronic apparatus 1 is placed on a desk. The upper wall 6 is opposite to the lower wall 7 with a space therebetween and extends substantially in parallel to the lower wall 7. An input portion 9 (i.e., input receiving portion) is provided on the upper wall 6. An example of the input portion 9 is a keyboard. The input portion 9 is not limited thereto, and it may be a touch panel or other input devices. The peripheral wall 8 connects a peripheral edge of the lower wall 7 and a peripheral edge of the upper wall 6.

As shown in FIG. 1, the second unit 3 is, for example, a display unit and includes a second housing 11 and a display device 12 provided in the second housing 11. The display device 12 is, for example, a liquid crystal display, but is not limited thereto. The display device 12 includes a display screen 12a that displays a video or an image.

The second housing 11 is rotatably (openably) connected to an end portion of the first housing 5 by the hinge portions 4a and 4b. In this way, the electronic apparatus 1 can be expanded between a first position where the first unit 2 and the second unit 3 overlap each other and a second position where the first unit 2 and the second unit 3 are opened. At the second position, the input portion 9 of the first unit 2 and the display screen 12a of the second unit 3 are exposed to the outside of the electronic apparatus 1.

Figure 2:
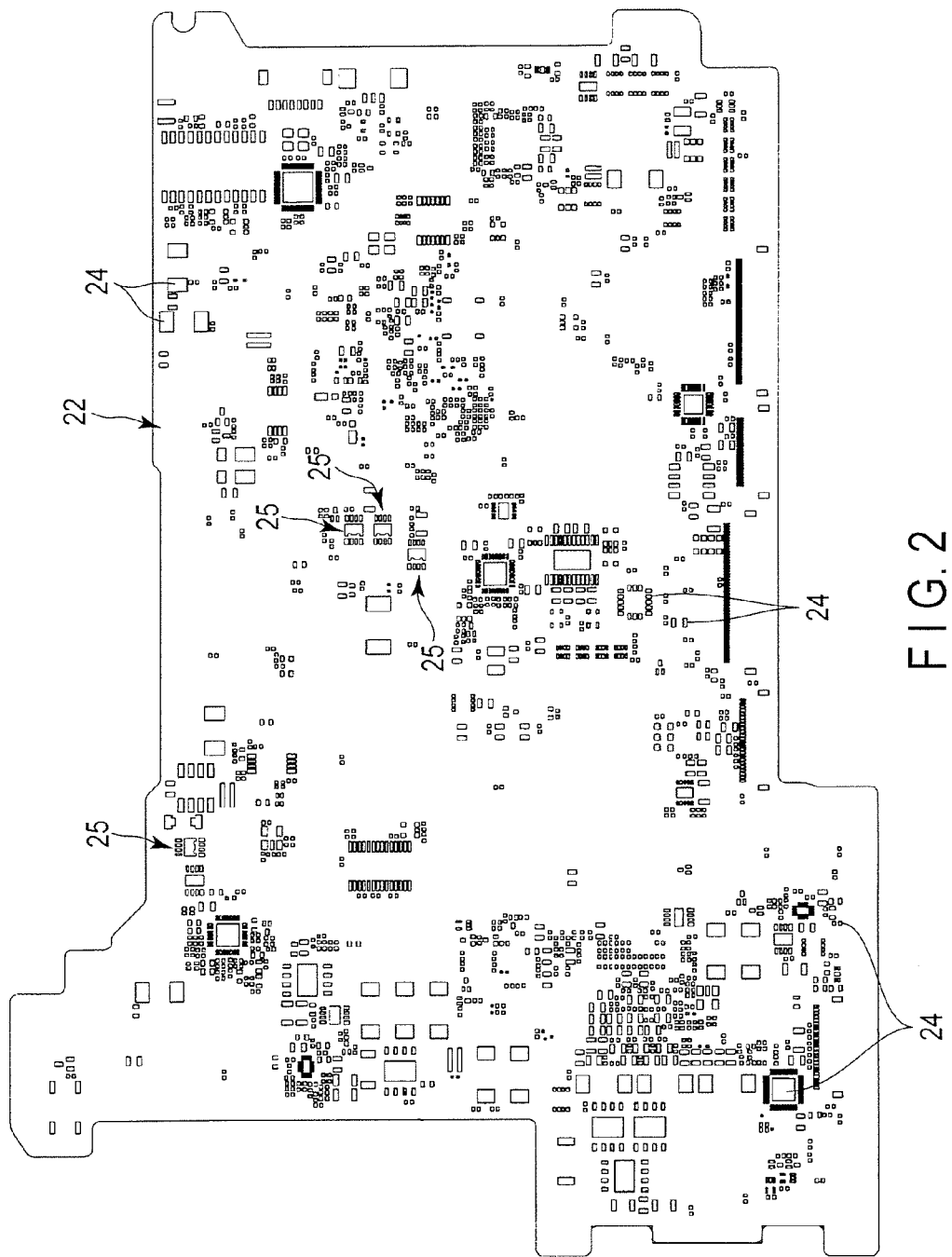
FIG. 2 is an exemplary plan view of a board according to the first embodiment.

As shown in FIG. 1, a printed circuit board 21 is provided in the first housing 5 of the first unit 2. The printed circuit board 21 is an example of a board assembly. The printed circuit board 21 includes a board 22 and components 23 (electronic components or semiconductor devices) mounted on the board 22. As shown in FIG. 2, the board 22 includes a plurality of pads 24. The plurality of pads 24 include at least one common mounting pad 25. The common mounting pad 25 (hereinafter, simply referred to as a pad 25) corresponds to a plurality of kinds of components and one of the components is selectively mounted on the common mounting pad 25.

Figure 5:
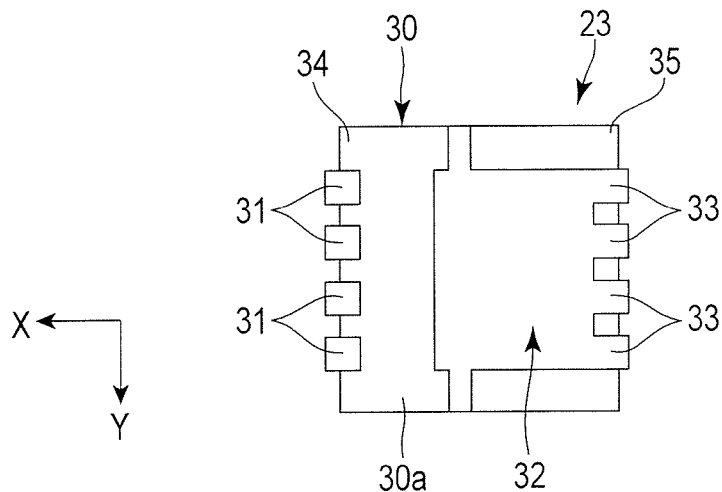
FIG. 5 is an exemplary bottom view of an example of a component configured to be mounted on the pad shown in FIG. 3.

FIG. 5 is a view illustrating an example of the component 23 configured to be mounted on the pad 25, as viewed from the rear surface side (lower surface side). The component 23 is, for example, a semiconductor component and includes a sealing portion 30 having a semiconductor provided therein and first to third electrodes 31, 32, and 33 provided in the sealing portion 30. The sealing portion 30 is a so-called case (casing body) and has a semiconductor sealed therein.

As shown in FIG. 5, the sealing portion 30 has, for example, a substantially rectangular shape and includes a rear surface 30a facing the board 22. The rear surface 30a is an example of a "region configured to face the board" in the sealing portion. The sealing portion 30 includes a first end 34 and a second end 35 opposite to the first end 34.

A plurality of first electrodes 31 are provided in the first end 34 of the sealing portion 30. The first electrodes 31 are arranged along the edge of the first end 34. An example of the first electrode 31 is a signal lead (signal terminal) as a first terminal. A plurality of third electrodes 33 are provided in the second end 35 of the sealing portion 30. The third electrodes 33 are arranged along the edge of the second end 35. An example of the third electrode 33 is a ground lead (ground terminal) as a second terminal.

The second electrode 32 is provided on the rear surface 30a of the sealing portion 30. The second electrode 32 is an example of a so-called rear electrode. The second electrode 32 has a plate shape and is larger than the first and third electrodes 31 and 33. An example of the second electrode 32 is a heat radiating conductor and the second electrode 32 has a relatively large area.

As shown in FIG. 5, the component 23 has an electrode structure that is asymmetric with respect to the center of the rear surface 30a. An example of the component 23 is a field effect transistor (FET). The second electrode 32 is provided at, for example, a position that deviates from the center of the rear surface 30a to the third electrode 33. The second electrode 32 is connected to, for example, the third electrodes 33 and is formed integrally with the plurality of third electrodes 33. For example, the second electrode 32 and the third electrodes 33 form a ground electrode with a ground potential. That is, an example of the second electrode 32 is an electrode that strengthens ground connection as measures for electromagnetic waves. The second electrode 32 may be formed separately from the third electrodes 33. An example of the second electrode 32 is a power supply electrode.

Figure 6:
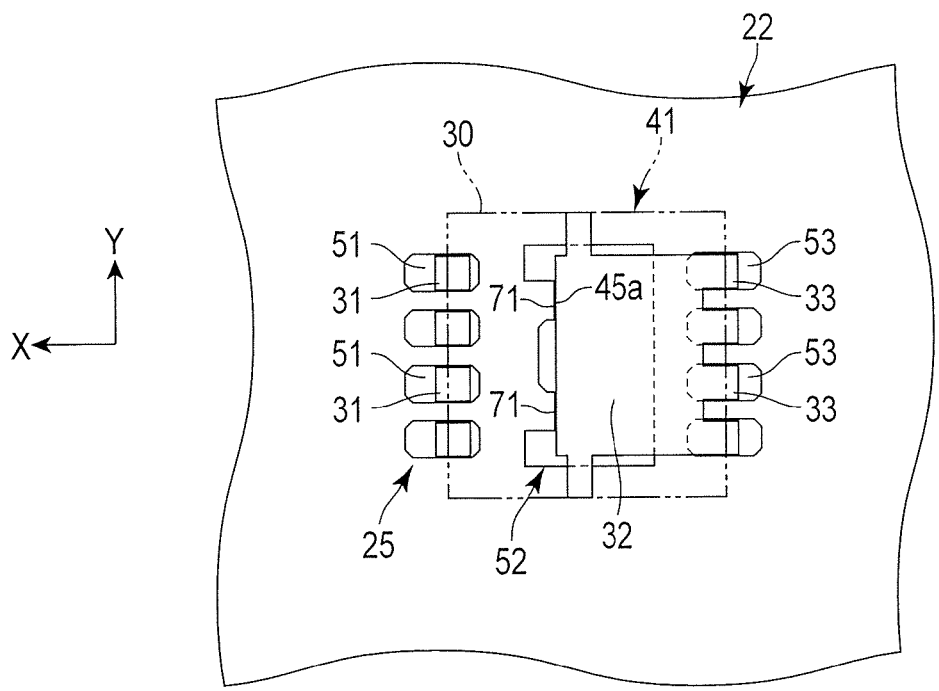
FIG. 6 is an exemplary plan view of the mounting of a first component on the pad shown in FIG. 3.

FIGS. 6, 7, and 8 show three kinds of components 41, 42, and 43 having substantially the same structure as the component 23 shown in FIG. 5. FIGS. 6, 7, and 8 show the components 41, 42, and 43, as viewed from the upper side. For convenience of explanation, the sealing portion 30 is represented by a two-dot chain line and the electrodes 31, 32, and 33 are represented by a solid line. In FIGS. 6, 7, and 8, structures having the same or similar functions as those in the component 23 shown in FIG. 5 are denoted by the same reference numerals and the description thereof will not be repeated.

In the three kinds of components 41, 42, and 43, the second electrodes 32 (rear electrodes) have different sizes. In the three kinds of components 41, 42, and 43, the other structures may be identical to or different from each other. For example, the three kinds of components 41, 42, and 43 have the same function, but the embodiment is not limited thereto. The three kinds of components 41, 42, and 43 may have different functions.

As shown in FIGS. 6, 7, and 8, the first to third components 41, 42, and 43 include, for example, the sealing portions 30 having substantially the same outward shape and the first and third electrodes 31 and 33 which are arranged substantially at the same position. The first to third components 41, 42, and 43 include the second electrodes 32 with different sizes.

For example, the second electrode 32 of the second component 42 is larger than the second electrode 32 of the first component 41. The edge 45b of the second electrode 32 of the second component 42 is closer to the first electrode 31 than the edge 45a of the second electrode 32 of the first component 41.

In addition, the second electrode 32 of the third component 43 is larger than the second electrode 32 of the second component 42. The edge 45c of the second electrode 32 of the third component 43 is closer to the first electrode 31 than the edge 45b of the second electrode 32 of the second component 42. The edges 45a, 45b, and 45c of the second electrodes 32 are disposed opposite to the third electrodes 33. For example, the edges 45a, 45b, and 45c extend in a direction substantially perpendicular to the direction from the second electrode 32 to the first electrode 31.

Next, the pad 25 will be described with reference to FIGS. 3 and 4.

The pad 25 corresponds to all of the first to third components 41, 42, and 43 and any one of the first to third components 41, 42, and 43 is selectively mounted as the component 23 on the pad 25.

As shown in FIGS. 3 and 4, the pad 25 includes first to third pad portions 51, 52, and 53. The first pad portion 51 is an example of a "first portion" of the pad 25. The second pad portion 52 is an example of a "second portion" of the pad 25. The third pad portion 53 is an example of a "third portion" of the pad 25.

A plurality of first pad portions 51 are provided so as to correspond to the first electrodes 31 and the first electrodes 31 are bonded to the first pad portions 51 by a bonding material 55. An example of the bonding material 55 is solder. A plurality of third pad portions 53 are provided so as to correspond to the third electrodes 33 and the third electrodes 33 are bonded to the third pad portions 53 by the bonding material 55.

The second pad portion 52 is provided so as to correspond to the second electrode 32 and is provided between the first pad portions 51 and the third pad portions 53. The second electrode 32 is bonded to the second pad portion 52 by the bonding material 55.

Next, a first direction X and a second direction Y are defined. The first direction X and the second direction Y are along the surface of the board 22. The first direction X is from the second pad portion 52 to the first pad portion 51. The second direction Y is crossing (for example, is substantially perpendicular to) the first direction X.

As shown in FIG. 3, the second pad portion 52 includes a first end 52a that is close to the first pad portion 51 and a second end 52b that is close to the third pad portion 53. The second end 52b is formed in a substantially straight line. The first end 52a is uneven.

Specifically, the second pad portion 52 includes first to third regions 61, 62, and 63. In this embodiment, the first to third regions 61, 62, and 63 are integrated with each other, but the embodiment is not limited thereto. The first to third regions 61, 62, and 63 may be separated from each other.

As shown in FIG. 3, for example, the first region 61 is disposed between the second region 62 and the third region 63. The first region 61 corresponds to the first component 41. As shown in FIG. 6, the first region 61 includes a first side 71 (first edge) that corresponds to at least a portion of an edge 45a of the second electrode 32 of the first component 41. That is, the first side 71 extends substantially in parallel to the edge 45a of the second electrode 32 of the first component 41 and is adjacent to the edge 45a of the second electrode 32 of the first component 41.

The term "corresponding to the edge" is not limited to complete overlap (accord) with the edge, but it may include positioning close (for example, in the vicinity of) to the edge. In addition, the term "corresponding to the edge" is not limited to "correspondence over the entire length of the edge", but it may include "corresponding to a portion of the edge".

The second region 62 is a region that corresponds to the second component 42. As shown in FIG. 3, the second region 62 includes a portion (first convex portion) that protrudes from the first region 61 toward the first pad portion 51. That is, the second region 62 protrudes from the first region 61 toward the first pad portion 51. Specifically, the second region 62 includes a first part 62a that is adjacent to (i.e., lined with) the first region 61 in the second direction Y and a second part 62b that is not adjacent to (i.e., not lined with) the first region 61 in the second direction Y. The second part 62b is an example of the first convex portion.

As shown in FIG. 7, the second part 62b includes a second side 72 (second edge) that corresponds to at least a portion of an edge 45b of the second electrode 32 of the second component 42. That is, the second side 72 extends substantially in parallel to the edge 45b of the second electrode 32 of the second component 42 and is adjacent to the edge 45b of the second electrode 32 of the second component 42.

The third region 63 is a region that corresponds to the third component 43. As shown in FIG. 3, the third region 63 includes a portion (second convex portion) that protrudes with respect to the second region 62 toward the first pad portion 51. That is, the third region 63 protrudes with respect to (i.e., compared to) the second region 62 toward the first pad portion 51. Specifically, the third region 63 includes a first part 63a that is adjacent to (i.e., lined with) the first and second regions 61 and 62 in the second direction Y and a second part 63b that is not adjacent to (i.e., not lined with) the first and second regions 61 and 62 in the second direction Y. The second part 63b is an example of the second convex portion.

As shown in FIG. 8, the second part 63b includes a third side 73 (third edge) that corresponds to at least a portion of an edge 45c of the second electrode 32 of the third component 43. That is, the third side 73 extends substantially in parallel to the edge 45c of the second electrode 32 of the third component 43 and is adjacent to the edge 45c of the second electrode 32 of the third component 43.

As shown in FIG. 3, the length of the first end 52a of the second pad portion 52 is equally divided corresponding to the number of components configured to be mounted on the pad 25. In this embodiment, the length of the first end 52a of the second pad portion 52 is trisected corresponding to three kinds of components 41, 42, and 43. That is, the length L1 of the first side 71, the length L2 of the second side 72, and the length L3 of the third side 73 are substantially equal to each other.

As shown in FIG. 3, the board 22 includes an insulation portion 75 (non-pad portion) that is defined by the uneven shape of the first end 34 of the pad 25 and is between a pair of the third regions 63. For example, a resist is provided in the insulation portion 75 such that the bonding material 55 is not spread.

The insulation portion 75 includes a first part 75a and a second part 75b. The first part 75a is defined between the first side 71 and the second side 72 and is adjacent to the second part 62b of the second region 62 in the second direction Y. The second part 75b is defined between the second side 72 and the third side 73 and is adjacent to the second part 63b of the third region 63 in the second direction Y.

As shown in FIG. 6, the first component 41 is bonded to the first region 61, the first part 62a of the second region 62, and a part of the first part 63a of the third region 63. As shown in FIG. 7, the second component 42 is bonded to the first region 61, the first and second parts 62a and 62b of the second region 62, and the first part 63a of the third region 63 and overlaps the first part 75a of the insulation portion 75. As shown in FIG. 8, the third component 43 is bonded to the first region 61, the first and second parts 62a and 62b of the second region 62, and the first and second parts 63a and 63b of the third region 63 and overlaps the first and second parts 75a and 75b of the insulation portion 75.

Next, the operation of the pad 25 will be described.

During the mounting of the component 23 on the pad 25, the bonding material 55, such as solder, is supplied onto the pad 25 in advance and the bonding material 55 is melted by a reflow process to bond the electrodes 31, 32, and 33 of the component 23 to the pad 25. During the reflow process, the bonding material 55 is melted to have fluidity and is spread so as to correspond to the shape of the pad 25. Then, the bonding material 55 generates surface tension at the sides 71, 72, and 73 of the pad 25.

During soldering, the molten bonding material 55 is spread to the entire pad portion 52 (that is, the first to third regions 61, 62, and 63) and surface tension is applied between the molten bonding material on the entire pad portion 52 and the electrode 32. On the other hand, for convenience of explanation, the individual phenomenon will be described focusing on the surface tension occurring in a specific region.

As shown in FIG. 6, when the first component 41 is mounted, the position of the second electrodes 32 of the first component 41 is likely to be stabilized due to the surface tension of the bonding material 55 occurring at the first side 71. That is, when the second electrodes 32 of the first component 41 are moved toward the first pad portion 51 over the first side 71, tensile force is applied to the first component 41 in a direction opposite to the moving direction due to the surface tension of the bonding material 55 occurring at the first side 71. In this way, the positional deviation of the first component 41 is suppressed and the first component 41 is held at the position where the edge 45a of the second electrode 32 is adjacent to the first side 71.

As shown in FIG. 7, when the second component 42 is mounted, the position of the second electrodes 32 of the second component 42 is likely to be stabilized due to the surface tension of the bonding material 55 occurring at the second side 72. That is, when the second electrodes 32 of the second component 42 are moved toward the first pad portion 51 over the second side 72, tensile force is applied to the second component 42 in a direction opposite to the moving direction due to the surface tension of the bonding material 55 occurring at the second side 72. In this way, the positional deviation of the second component 42 is suppressed and the second component 42 is held at the position where the edge 45b of the second electrode 32 is adjacent to the second side 72.

As shown in FIG. 8, when the third component 43 is mounted, the position of the second electrodes 32 of the third component 43 is likely to be stabilized due to the surface tension of the bonding material 55 occurring at the third side 73. In this way, the positional deviation of the third component 43 is suppressed and the third component 43 is held at the position where the edge 45c of the second electrode 32 is adjacent to the third side 73.

According to this structure, it is possible to selectively mount a plurality of kinds of components 41, 42, and 43 on one kind of pad 25. When any component is mounted, the positional deviation of the component is suppressed.

In some cases, in the components that have the same function and are manufactured by different manufacturers, the second electrodes 32 (rear electrodes) have different sizes. In this case, it is considered that a pad is formed in a rectangular shape corresponding to the maximum electrode size, in order to respond to a plurality of kinds of components including the second electrodes 32 having different sizes with one kind of pad.

However, in this case, during the mounting of a component with an electrode size which is not the maximum electrode size on the pad, when the bonding material 55 has fluidity in the reflow process, the component is moved due to the balance between the surface tensions of solder on the pad such that the edge of the electrode overlaps the edge of the pad. As a result, the positional deviation of the component is likely to occur.

In contrast, in this embodiment, the pad 25 includes the first pad portion 51 and the second pad portion 52 including a portion that protrudes toward the first pad portion 51. According to this structure, since the length of the edge of the pad close to the first pad portion 51 is reduced, it is possible to reduce force to draw the component 23 toward the first pad portion 51, as compared to a structure in which a rectangular pad is provided. In addition, when the electrode 32 of the component 23 are moved toward the first pad portion 51 over the first side 71, force is applied to the component 23 in a direction opposite to the moving direction due to the surface tension occurring at the first side 71. On the contrary, when the electrode 32 of the component 23 are moved toward the third pad portion 53 over the third side 73, force is applied to the component 23 in a direction opposite to the moving direction due to the surface tension occurring at the third side 73. Therefore, the position of the component 23 is likely to be stabilized and the positional deviation thereof is less likely to occur.

In this embodiment, the pad 25 includes the first side 71 that corresponds to at least a portion of the electrode 32 of the first component 41 and the second side 72 that corresponds to at least a portion of the electrode 32 of the second component 42. According to this structure, the position of the electrode 32 of the first component 41 is likely to be stabilized by the first side 71. In addition, the position of the electrode 32 of the second component 42 is likely to be stabilized by the second side 72. Therefore, the positional deviation of each of the two components 41 and 42 is suppressed by one pad 25.

In this embodiment, the second pad portion 52 includes the first side 71 that corresponds to at least a portion of the edge 45a of the electrode 32 of the first component 41 and the second side 72 that corresponds to at least a portion of the edge 45b of the electrode 32 of the second component 42. According to this structure, the first component 41 is stabilized at the position where the edge 45a of the electrode 32 is adjacent to the first side 71. In addition, the second component 42 is stabilized at the position where the edge 45b of the electrode 32 is adjacent to the second side 72. Therefore, the positional deviation of each of the two components 41 and 42 is suppressed by one pad 25. In addition, since each of the first side 71 and the second side 72 can function as a positioning guide, the positional deviation of the components 41 and 42 is suppressed.

Each of the first to third components 41, 42, and 43 includes the sealing portion 30 having a semiconductor provided therein. At least a portion of the second electrode 32 is provided in a region of the sealing portion 30 facing the board 22. According to this structure, it is possible to suppress the positional deviation of a plurality of components 41, 42, and 43 including so-called rear surface electrodes with different sizes.

In this embodiment, the first and second regions 61 and 62 are integrated with each other. According to this structure, it is easy to supply the bonding material 55 to the first and second regions 61 and 62 and manufacturability is improved.

In this embodiment, the second pad portion 52 is provided between the first pad portions 51 and the third pad portions 53. According to this structure, it is possible to suppress the positional deviation of a plurality of components 41, 42, and 43 including the rear electrodes 32 with different sizes.

In this embodiment, the second pad portion 52 includes the third side 73 that corresponds to at least a portion of the edge 45c of the electrode 32 of the third component 43. According to this structure, it is possible to provide the common pad 25 that can correspond to three kinds of components 41, 42, and 43.

In this embodiment, the second and third regions 62 and 63 are separated on both sides of the first region 61. Therefore, the bonding material 55 in the second region 62 is not likely to be spread to the third region 63. That is, since the movement of the bonding material 55 is limited a little, the positional deviation of the components 41, 42, and 43 is further suppressed.

In this embodiment, the first to third sides 71, 72, and 73 have substantially the same length. According to this structure, it is possible to substantially uniformly distribute tensile force. Therefore, the positions of the three components 41, 42, and 43 are likely to be further stabilized.

Next, some modifications will be described with reference to FIGS. 9 and 10.

As shown in FIG. 9, the second pad portion 52 and the third pad portion 53 may be integrated with each other. According to this structure, it is possible to obtain the same effect as that of the above-described embodiment.

As shown in FIG. 10, in the second pad portion 52, the second end 52b may be uneven. That is, the second region 62 includes a portion that protrudes from the first region 61 toward the third pad portion 53. The third region 63 includes a portion that protrudes with respect to the second region 62 toward the third pad portion 53. According to this structure, it is easy to limit the movement of the bonding material 55 in the second pad portion 52. Therefore, the positions of the components 41, 42, and 43 are further stabilized.

Second Embodiment

Next, an electronic apparatus 1 according to a second embodiment will be described with reference to FIGS. 11, 12, and 13. In the second embodiment, components having the same or similar functions as those in the first embodiment are denoted by the same reference numerals and the description thereof will not be repeated. In addition, structures other than the following structures are the same as those in the first embodiment.

In this embodiment, a pad 25 corresponds to two kinds of components 41 and 42 and one of the first and second components 41 and 42 is selectively mounted as a component 23. Specifically, a second pad portion 52 includes the first and second regions 61 and 62. In this embodiment, the first and second regions 61 and 62 are integrated with each other, but the embodiment is not limited thereto. The first and second regions 61 and 62 may be separated from each other. In this embodiment, the length of a first end 52a of the second pad portion 52 is bisected corresponding to two kinds of components 41 and 42. That is, the length L1 of a first side 71 is substantially equal to the length L2 of a second side 72.

As shown in FIG. 11, a board 22 includes an insulation portion 75 (non-pad portion) that is defined by the uneven shape of a first end 52a of the second pad portion 52 and is between a pair of the second regions 62. The insulation portion 75 is between the first side 71 and the second side 72 and is adjacent to a second part 62a of the second region 62 in the second direction Y.

As shown in FIG. 12, the first component 41 is bonded to the first region 61 and the first part 62a of the second region 62. As shown in FIG. 13, the second component 42 is bonded to the first region 61 and the first and second parts 62a and 62b of the second region 62 and overlaps the insulation portion 75.

According to this structure, similarly to the first embodiment, a plurality of kinds of components 41 and 42 can be selectively mounted on one kind of pad 25. In addition, when any component is mounted, the positional deviation of the component is suppressed.

FIG. 14 shows a modification of the pad 25 according to this embodiment. As shown in FIG. 14, in the pad 25, the number of recess and protrusion portions may increase. That is, the pad 25 may include, for example, three or more first regions 61 and three or more second regions 62. In the example of the pad 25 in which the number of recess and protrusion portions increases, the sum of the lengths of a plurality of first sides 71 is substantially equal to the sum of the lengths of a plurality of second sides 72.

In the pad 25 including three regions 61, 62, and 63 according to the first embodiment, the number of recess and protrusion portions may increase, similarly to the structure shown in FIG. 14.

Third Embodiment

Next, an electronic apparatus 1 according to a third embodiment will be described with reference to FIGS. 15 to 18. In the third embodiment, components having the same or similar functions as those in the first embodiment are denoted by the same reference numerals and the description thereof will not be repeated. In addition, structures other than the following structures are the same as those in the first embodiment.

Figure 17:
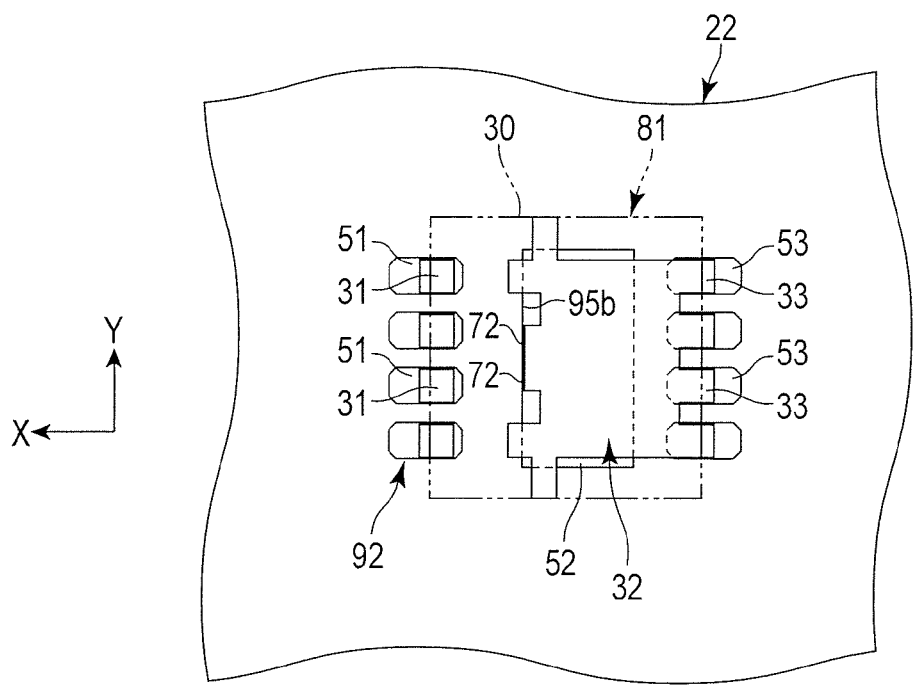
FIG. 17 is an exemplary plan view of the mounting of the component shown in FIG. 15 on a second pad.
Figure 18:
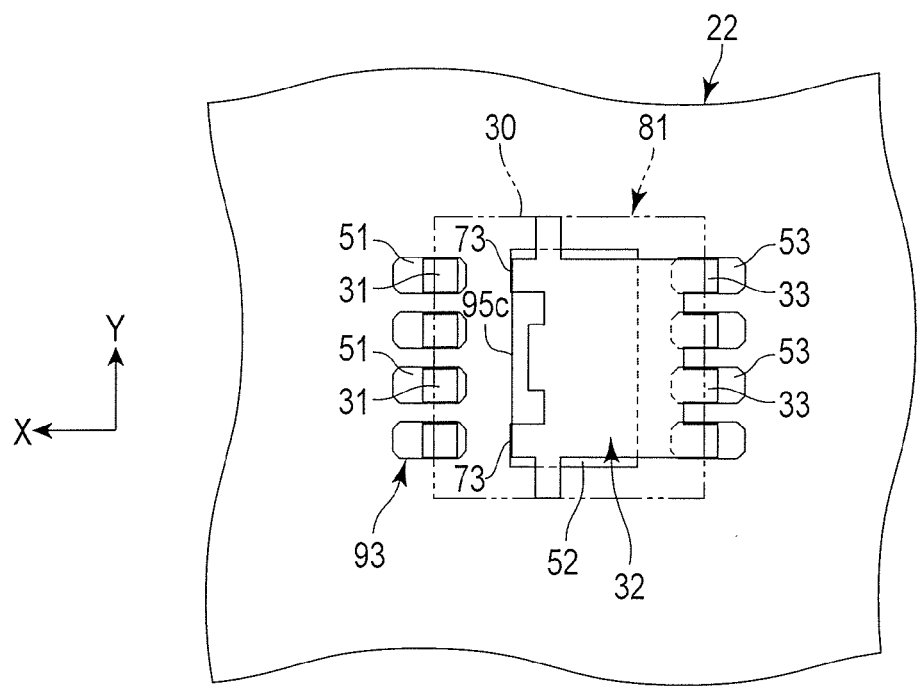
FIG. 18 is an exemplary plan view of the mounting of the component shown in FIG. 15 on a third pad.

A component 81 (electronic component) according to this embodiment corresponds to a plurality of kinds of pads (i.e., a plurality of kinds of boards) and includes a common mounting electrode that can be mounted on any of the pads. In this embodiment, the component 81 corresponds to, for example, three kinds of pads 91, 92, and 93 and includes an electrode 32 that can be mounted on any of the pads 91, 92, and 93. FIGS. 16, 17, and 18 show the three kinds of pads 91, 92, and 93 to which the component 81 corresponds.

As shown in FIGS. 16, 17, and 18, in the three kinds of pads 91, 92, and 93, the second pad portions 52 have different sizes. The other portions may be identical to or different from each other. For example, the three kinds of pads 91, 92, and 93 have the same function, but the embodiment is not limited thereto. The three kinds of pads 91, 92, and 93 may have different functions.

The first to third pads 91, 92, and 93 include, for example, substantially the same first and third pad portions 51 and 53. The first to third pads 91, 92, and 93 include the second pad portions 52 with different sizes.

For example, the second pad portion 52 of the second pad 92 is larger than the second pad portion 52 of the first pad 91. The edge 95b of the second pad portion 52 of the second pad 92 is closer to the first pad portion 51 than the edge 95a of the second pad portion 52 of the first pad 91.

In addition, the second pad portion 52 of the third pad 93 is larger than the second pad portion 52 of the second pad 92. The edge 95c of the second pad portion 52 of the third pad 93 is closer to the first pad portion 51 than the edge 95b of the second pad portion 52 of the second pad 92. The edges 95a, 95b, and 95c of the second pad portions 52 are disposed opposite to the third pad portions 53.

Next, the component 81 will be described.

FIG. 15 is a view illustrating an example of the component 81, as viewed from the rear surface side. The component 81 is, for example, a semiconductor component. The component 81 includes first to third electrodes 31, 32, and 33. The second electrode 32 includes a first end 32a that is close to the first electrode 31 and a second end 32b that is close to the third electrode 33. The second end 32b is formed in a substantially straight line. The first end 32a has an uneven shape.

The second electrode 32 includes first to third regions 61, 62, and 63. In this embodiment, the first to third regions 61, 62, and 63 are integrated with each other, but the embodiment is not limited thereto. The first to third regions 61, 62, and 63 may be separated from each other.

As shown in FIG. 15, for example, the first region 61 is provided between the second region 62 and the third region 63. The first region 61 corresponds to the first pad 91. As shown in FIG. 16, the first region 61 includes a first side 71 (first edge) that corresponds to at least a portion of the edge 95a of the second pad portion 52 of the first pad 91. That is, the first side 71 extends substantially in parallel to the edge 95a of the second pad portion 52 of the first pad 91 and is adjacent to the edge 95a of the second pad portion 52 of the first pad 91.

The second region 62 is a region that corresponds to the second pad 92. As shown in FIG. 17, the second region 62 includes a portion (first convex portion) that protrudes from the first region 61 toward the first electrode 31. That is, the second region 62 protrudes from the first region 61 toward the first electrode 31. The second region 62 includes a second side 72 (second edge) that corresponds to at least a portion of the edge 95b of the second pad portion 52 of the second pad 92. That is, the second side 72 extends substantially in parallel to the edge 95b of the second pad portion 52 of the second pad 92 and is adjacent to the edge 95b of the second pad portion 52 of the second pad 92.

The third region 63 is a region that corresponds to the third pad 93. As shown in FIG. 18, the third region 63 includes a portion (second convex portion) that protrudes with respect to (i.e., compared to) the second region 62 toward the first electrode 31. That is, the third region 63 protrudes with respect to the second region 62 toward the first electrode 31. The third region 63 includes a third side 73 (third edge) that corresponds to at least a portion of the edge 95c of the second pad portion 52 of the third pad 93. That is, the third side 73 extends substantially in parallel to the edge 95c of the second pad portion 52 of the third pad 93 and is adjacent to the edge 95c of the second pad portion 52 of the third pad 93.

As shown in FIG. 15, the length of the first end 32a of the second electrode 32 is equally divided corresponding to the kind of pad on which the component 81 is mounted. In this embodiment, the length of the first end 32a of the second electrode 32 is trisected corresponding to three kinds of pads 91, 92, and 93. That is, the length L1 of the first side 71, the length L2 of the second side 72, and the length L3 of the third side 73 are substantially equal to each other. The sealing portion 30 includes an insulation portion 75 (non-electrode portion) that is defined by the uneven shape of the first end 32a of the second electrode 32 and is between a pair of the third regions 63.

According to this structure, it is possible to mount the component 81 on any of a plurality of kinds of pads 91, 92, and 93 using the same operation as that in the first embodiment. In addition, when the component 81 is mounted on any of the pads 91, 92, and 93, the positional deviation of the component 81 is suppressed.

In some cases, in the pads on which components having the same function are mounted and which are manufactured by different manufacturers, the second pad portions 52 have different sizes. According to the component 81 of this embodiment, one kind of component 81 can correspond to a plurality of kinds of pads 91, 92, and 93 (that is, a plurality of kinds of boards) including the second pad portions 52 with different sizes.

As in the second embodiment relative to the first embodiment, the second electrode 32 may include only the first and second regions 61 and 62 and correspond to two kinds of pads 91 and 92. As in the structure shown in FIG. 14, in the second electrode 32, the number of recess and protrusion portions may increase.

According to the first to third embodiments, it is possible to suppress the positional deviation of the component.

The embodiments are not limited to the above-described embodiments, and the components of the above-described embodiments may be changed without departing from the scope and spirit of the invention. In addition, a plurality of components according to the above-described embodiments may be appropriately combined with each other to form various structures. For example, some of the components according to the above-described embodiments may be removed. Components according to different embodiments may be appropriately combined with each other.

For example, in the above-described embodiments, the pad 25 corresponds to two or three kinds of components and the component 81 corresponds to two or three kinds of pads. However, the embodiments are not limited thereto. The pad 25 may correspond to four or more kinds of components and the component 81 may correspond to four or more kinds of pads. The shapes of the pad 25 and the electrode 32 are not limited to the above. The first to third sides 71, 72, and 73 may have different lengths. The component 23 may not include the third electrode 33, and a portion of the second electrode 32 may be bonded to the third pad 53.

Next, some electronic apparatuses and components are additionally described.

An electronic apparatus according to a first aspect comprises a housing, a board provided in the housing and comprising one of a first pad and a second pad, and a component on the board. The component is configured to be selectively mounted on one of the first pad and the second pad. The component comprises an electrode comprising a first edge configured to correspond to at least a portion of the first pad and a second edge configured to correspond to at least a portion of the second pad.

An electronic apparatus according to a second aspect comprises a housing, a board provided in the housing and comprises a pad comprising a first portion and a second portion, and a component on the pad. The component comprises a first electrode configured to be bonded to the first portion and a second electrode comprising a portion protruding toward the first electrode and configured to be bonded to the second portion.

A component (e.g., semiconductor device) according to a third aspect is configured to be selectively mounted on one of a first pad and a second pad. The component comprises an electrode comprising a first edge configured to correspond to at least a portion of the first pad and a second edge configured to correspond to at least a portion of the second pad.

A component (e.g., semiconductor device) according to a fourth aspect comprises a first electrode and a second electrode. The second electrode comprises a portion protruding toward the first electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing;
a board in the housing;
a pad on the board, the pad comprising a first portion and a second portion; and
one of a first component and a second component, each of the first component and the second component comprising
 a terminal configured to be bonded to the first portion,
 a sealing portion comprising a semiconductor and a region configured to face the board, and
 an electrode on the region of the sealing portion, the electrode configured to be bonded to the second portion, the electrode of the first component being different in size from the electrode of the second component,
wherein the first portion and the second portion are arranged in a first direction,
each of the electrode of the first component and the electrode of the second component comprises an edge configured to be close to the first portion, the edge extending in a second direction substantially perpendicular to the first direction,
the second portion comprises a first region and a second region formed contiguously with the first region, the second region comprising a first part adjacent to the first region in the second direction, and a second part extending from the first part toward the first portion to be closer to the first portion than the first region is,
the first region comprises a first side extending in the second direction and configured to be along the edge of the electrode of the first component,
the second part of the second region comprises a second side extending in the second direction and configured to be along the edge of the electrode of the second component,
the electrode of the first component is configured to be bonded to the first region and the first part of the second region, and
the electrode of the second component is configured to be bonded to the first region and the first and second parts of the second region.

2. The electronic apparatus of claim 1,
wherein the board comprises an insulating portion between the first side and the second side, the insulating portion being adjacent to the second part of the second region in the second direction, and the electrode of the second component is configured to overlap the insulating portion.

3. The electronic apparatus of claim 1, wherein the pad comprises a third portion to which one of the electrode of the first component or the second component, and another terminal contiguous with or separated from the electrode of the first component or the second component is configured to be bonded, and the second portion is between the first portion and the third portion.

4. The electronic apparatus of claim 1, wherein the electronic apparatus comprises any one of the first component, the second component and a third component, the third component comprising an electrode configured to be bonded to the second portion, the electrode of the third component being different in size from the electrode of the first component and the electrode of the second component, and comprising an edge configured to be close to the first portion, the edge extending in the second direction, the second portion comprises a third region comprising a first part arranged with the first region and the second region in the second direction, a second part extending from the first part toward the first portion to be closer to the first portion than the second region is, the second part of the third region comprises a third side extending in the second direction and configured to be along the edge of the electrode of the third component, the electrode of the third component is configured to be bonded to the first region, the first and second parts of the second region, and the first and second parts of the third region.

5. The electronic apparatus of claim 1, wherein the first side and the second side are substantially equal in length.

\* \* \* \* \*